US006388436B1

United States Patent
Nodot et al.

(10) Patent No.: US 6,388,436 B1
(45) Date of Patent: May 14, 2002

(54) APPARATUS FOR CALIBRATING THE ALIGNMENT OF A WAFER CASSETTE HOLDER TO A ROBOT BLADE

(75) Inventors: Jean-Claude Nodot, Rambouillet; Jacky Winter, Athis-Mons, both of (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/579,045

(22) Filed: May 26, 2000

(30) Foreign Application Priority Data

Aug. 6, 1999 (EP) .............................. 99480045

(51) Int. Cl.[7] .......................... G01R 31/26; B65G 49/07
(52) U.S. Cl. ...................... 324/158.1; 414/936; 33/613; 257/678
(58) Field of Search ............................. 324/158.1, 765, 324/758; 414/217.1, 217, 805, 806, 416.01, 936; 257/678; 33/613

(56) References Cited

U.S. PATENT DOCUMENTS

| | | | |
|---|---|---|---|
| 5,438,418 A | | 8/1995 | Fukui et al. |
| 5,697,748 A | * | 12/1997 | Somekh et al. .............. 414/217 |
| 5,905,302 A | * | 5/1999 | Lane et al. .................. 257/678 |

FOREIGN PATENT DOCUMENTS

| | | |
|---|---|---|
| CH | 683420 A5 | 3/1994 |
| WO | WO 99/02996 | 1/1999 |

* cited by examiner

Primary Examiner—Michael J. Sherry
Assistant Examiner—Paresh Patel
(74) Attorney, Agent, or Firm—Todd M. C. Li

(57) ABSTRACT

APPARATUS FOR CALIBRATING the position of the support platform of a wafer cassette holder with respect to a robot blade. The apparatus comprises a housing including an open front portion which permits the convenient extending of the robot blade into the housing when the apparatus is placed on the support platform. The housing further comprising detecting and measuring means for detecting the presence underneath of a wafer held by the extended robot blade, and measuring the spacing between the detecting and measuring means and the wafer; and a display panel coupled to the detecting and measuring means for displaying spacing information which indicates to a user the moment when the spacing between the wafer and the detecting and measuring means reaches at least one predetermined spacing value including a desired spacing value. That way, when the apparatus is placed on the support platform with the robot blade holding a wafer positioned underneath the detecting and measuring means, the calibration of the position of the wafer cassette holder is carried out by adjusting the position of the support platform so as to reach the desired spacing value.

20 Claims, 9 Drawing Sheets

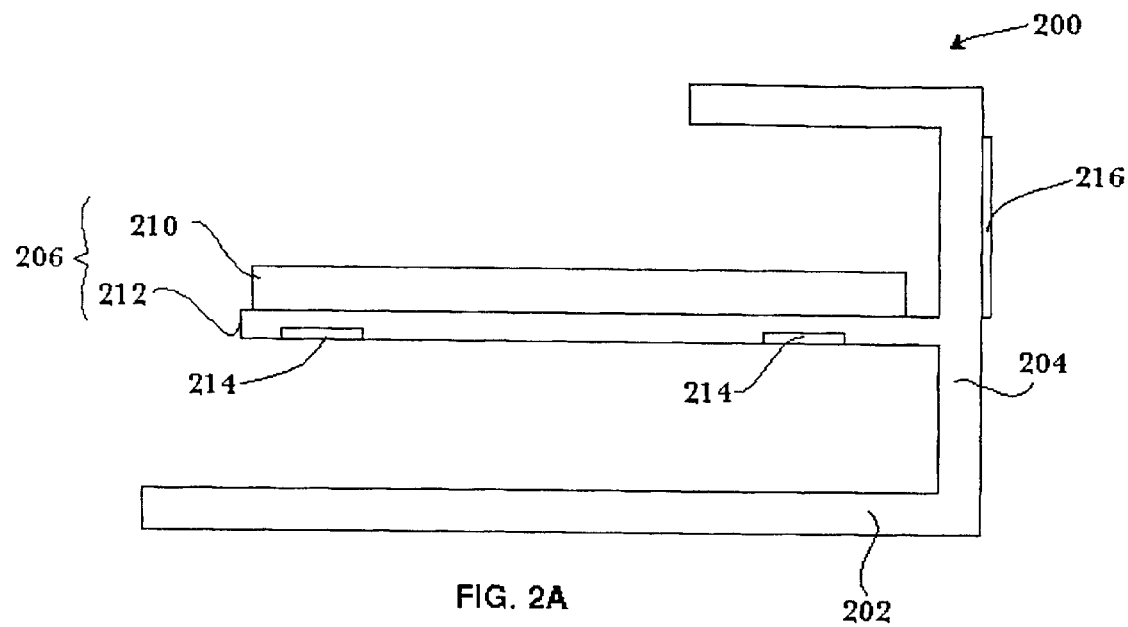
FIG. 2A
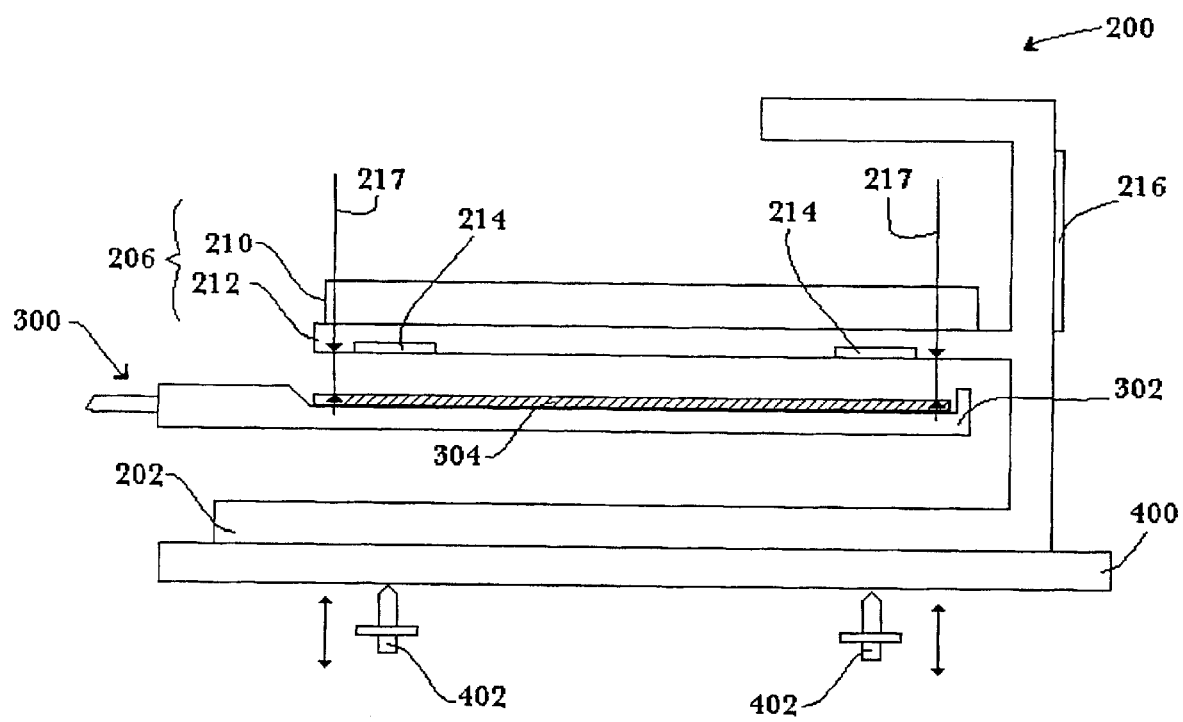
FIG. 2B
FIG. 2

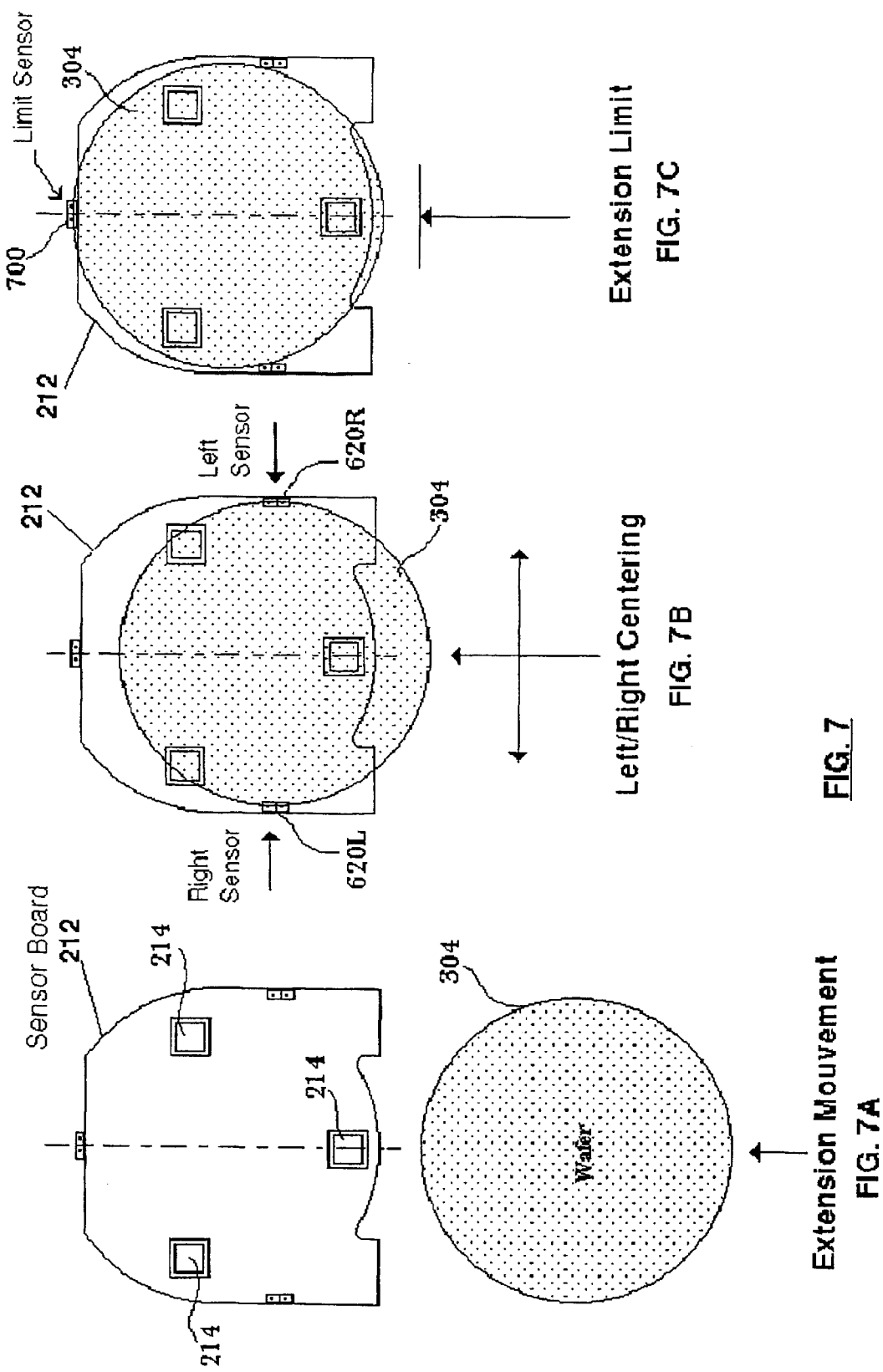

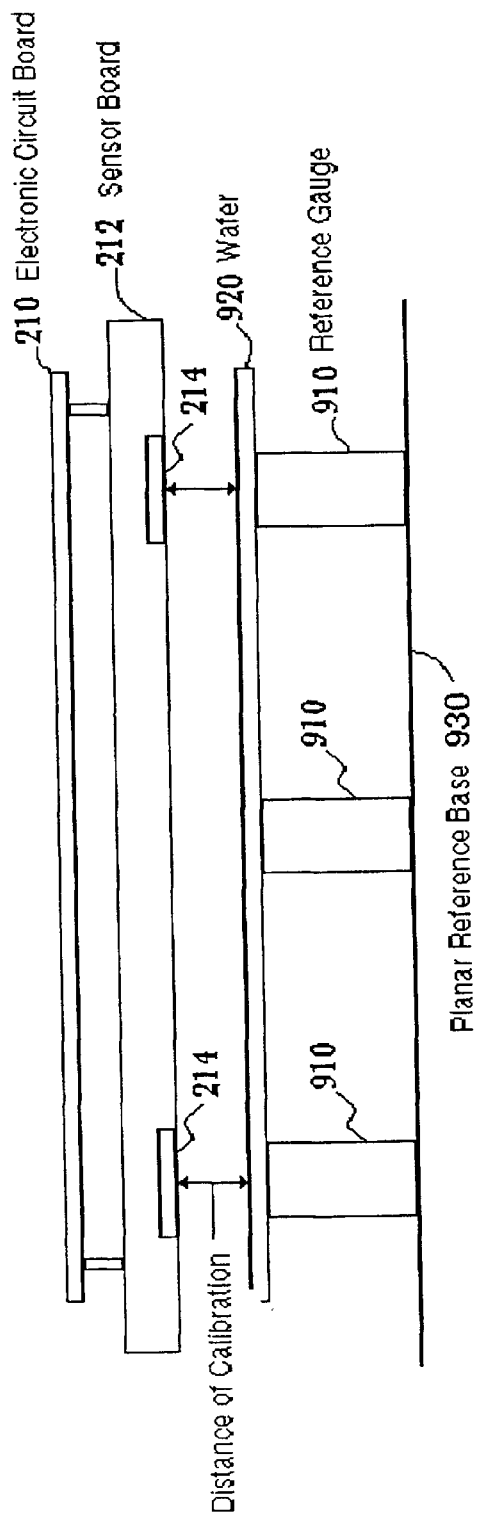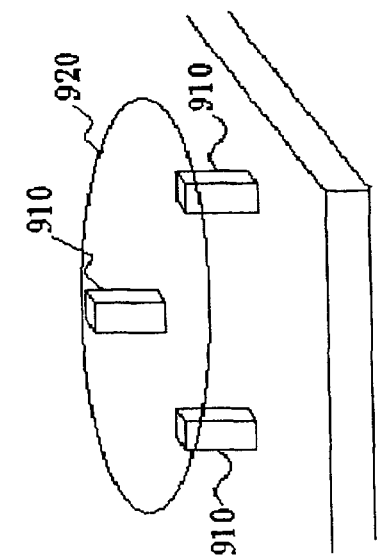
FIG. 9

APPARATUS FOR CALIBRATING THE ALIGNMENT OF A WAFER CASSETTE HOLDER TO A ROBOT BLADE

TECHNICAL FIELD

The invention generally relates to wafer cassette holding mechanisms in semiconductor manufacturing equipments. More particularly, the invention relates to an apparatus for calibrating the position of the support platform of a wafer cassette holder with respect to a robot blade so as to achieve alignment to the robot blade of cassettes placed upon the support platform.

BACKGROUND ART

Modern semiconductor manufacturing equipments use automated wafer transport systems in order to reduce human handling of wafers and therefore decrease the risks of particle contamination of the wafers. In such semiconductor processing equipments, wafers are generally stored in cassettes having parallel, stacked slots each of which is receptive to a single, often horizontally oriented, wafer. Typically, a cassette is placed on a cassette holder of the wafer processing equipment and the blade of a robot arm extends to slots in the cassette for loading or unloading wafers from the cassette. Given the high sensibility and fragility of the wafers to contacts, such a robot arm must be very accurate in loading and unloading wafers from a cassette, so as to avoid any rubbing or shocks that could damage the wafers. In this end, the cassette placed on a cassette holder must be accurately aligned to the blade of the robot arm. Typically, a cassette holder includes an adjustment means such as screws, for tuning the level position of the support platform. By using this adjustment means, a human operator can adjust the height and the parallelism of a cassette placed on the support platform with respect to the blade of the robot arm. When the adjustment of the cassette alignment is complete, the level position of the support platform is considered calibrated. However, this adjustment procedure suffers from the problem that it is subject to human errors as the cassette alignment with regard to the blade is visually evaluated. Moreover, the accuracy of the cassette alignment is variable depending on the person in charge of the calibration, and the adjustment is not repeatable as no two cassette alignments can be made identical by one person. Furthermore, errors in appreciation may sometimes result in scratched wafer, increased contamination, and time loss.

SUMMARY OF THE INVENTION

A main object of the invention is therefore to provide a wafer cassette holder calibration apparatus that enables a human operator to calibrate the alignment of a wafer cassette holder with respect to the blade of a robot arm, thereby achieving a highly accurate and repeatable adjustment.

In brief, in accordance with the appended set of claims, this object is achieved by providing an APPARATUS FOR CALIBRATING the position of the support platform of a wafer cassette holder with respect to a robot blade. The apparatus comprises a housing including an open front portion which permits the convenient extending of the robot blade into the housing when the apparatus is placed on the support platform. The housing further comprising detecting and measuring means for detecting the presence of a wafer held by the extended robot blade, and measuring the spacing between the detecting and measuring means and the wafer; and a display panel coupled to the detecting and measuring means for displaying spacing information which indicates to a user the moment when the spacing between the wafer and the detecting and measuring means reaches at least one predetermined spacing value including a desired spacing value. That way, when the apparatus is placed on the support platform with the robot blade holding a wafer positioned underneath the detecting and measuring means, the calibration of the position of the wafer cassette holder is carried out by adjusting the position of the support platform so as to reach the desired spacing value. This desired spacing value is typically specified by the cassettes manufacturer.

More specifically, the detecting and measuring means of the calibration apparatus comprises a sensor board which includes a plurality of sensors, and an electronic circuit board which includes electronic circuitry coupled to the first plurality of sensors for processing first electrical signals issued by the plurality of sensors and providing to the display panel second electrical signals indicative of the spacing between each of the sensors and the wafer, upon which the spacing information can be displayed.

In a preferred embodiment of the invention, the sensor board comprises three capacitive sensors, one of which being positioned at the front middle portion of the sensor board and the other two being positioned laterally at opposite sides of the sensor board. The apparatus of the invention is advantageously mounted into a standard wafer cassette with the sensor board mounted substantially parallel to the wafer slots of the wafer cassette, and the display panel being mounted at the back side of the cassette. This contributes to render the calibration apparatus particularly easy to carry and transport.

Still in a preferred embodiment, the display panel of the calibration apparatus of the invention includes a plurality of light-emitting diodes of different colours, whereby an user knows that the desired spacing value is reached for each one of the sensors when a diode of a same predetermined colour is activated for each of the sensors. This makes the display panel particularly convenient and simple for determining that the calibration is complete, without any risk of erroneous interpretation of the information displayed. The display panel advantageously allows to detect a robot blade twist.

Still in accordance with a preferred embodiment of the invention, the display panel includes additional display means coupled to additional sensors in the sensor board through additional electronic circuitry in the electronic circuit board, in order to enable an user to perform robot blade droop measurement, and/or wafer centering measurement, and/or robot blade extension limit measurement.

Still other features of the invention are set out in the dependent claims.

In summary, besides being an efficient and reliable tool for CALIBRATING THE ALIGNMENT OF A WAFER CASSETTE HOLDER TO A ROBOT BLADE, the calibration apparatus of the invention is easy to use, in particular thanks to its advantageous display panel which is also not subject to misinterpretation of the information displayed upon which the adjustment is controlled. Furthermore, the calibration apparatus of the invention is easy to carry and transport, in particular when it is mounted into a standard wafer cassette. It is also technically simple, in particular it does not require a computer console, thus its manufacturing is cost effective.

BRIEF DESCRIPTION OF THE DRAWINGS

In the detailed description to follow, reference will be made to the accompanying drawings where like reference numerals are used to identify like parts in the various views and in which:

FIG. 2 which includes FIGS. 2A and 2B illustrates the basic principle of a calibration apparatus according to the invention, with FIG. 2A showing a schematic side view of the calibration apparatus, and FIG. 2B showing the calibration apparatus of FIG. 2A in operation;

FIG. 7 which includes FIGS. 7A–7C shows the different sensors required to perform the different measurements whose results are displayed in the display panel of FIG. 6;

FIG. 9 which includes FIGS. 9A and 9B, is a simplified schematic illustrating how the electronic circuitry of FIG. 8A is calibrated prior to using the calibration apparatus of the invention.

DETAILED DESCRIPTION OF THE INVENTION

According to the invention there is disclosed herein an apparatus for calibrating the position of the support platform of a wafer cassette holder with respect to a robot blade of an automated wafer transport system in a semiconductor manufacturing equipment.

Figure 1:
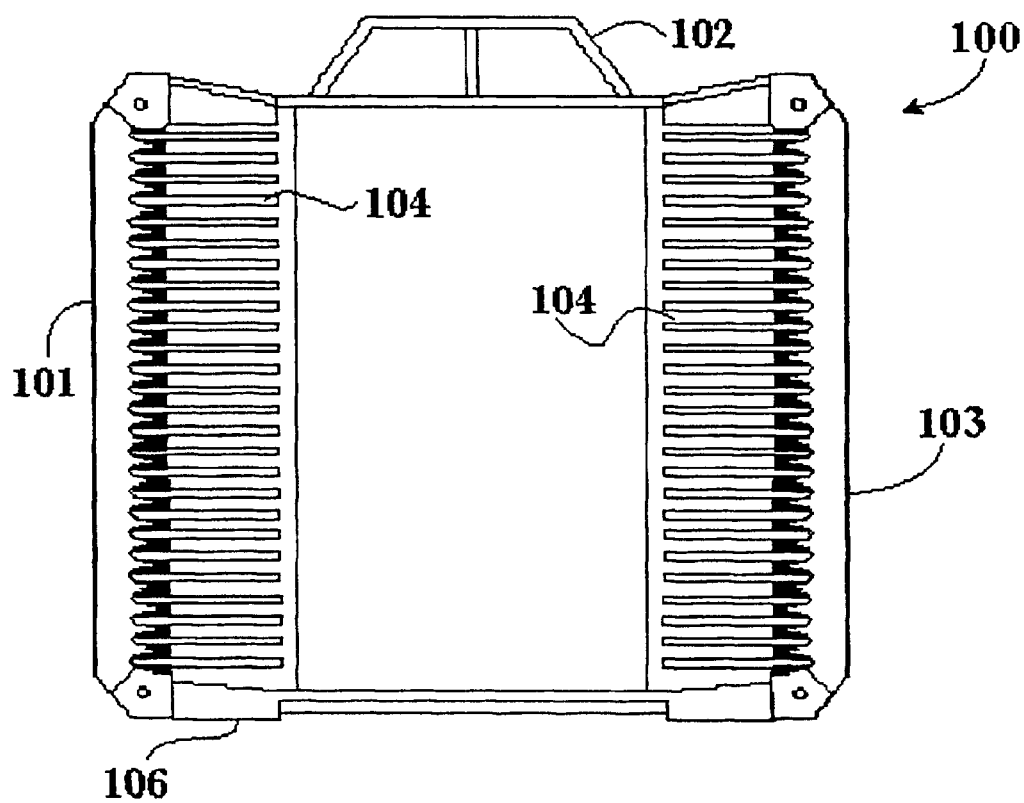
FIG. 1 is a front elevation view of a standard wafer cassette.

With reference to FIG. 1 there is shown a front elevation view of a standard wafer cassette of the type that is held by a wafer cassette holder to be calibrated by the calibration apparatus of the invention according to a preferred embodiment. In FIG. 1, cassette 100 suitably comprises an open front portion which permits the convenient loading and unloading of wafers into the cassette, a bottom portion 106, a left side panel 101 and a right side panel 103. Left side panel 101 and right side panel 103 each comprise a plurality of slots 104 within which individual wafers are stored. As can be seen in FIG. 1, slots 104 are horizontal and vertically stacked. When such a wafer cassette is placed upon a support platform in a automated wafer transport system, each slot of the cassette is generally known by the wafer. transport system by reference to an associated number.

FIG. 2 through FIGS. 2A and 2B illustrates the basic principle of an apparatus according to the invention. Referring to FIG. 2A, there is shown a schematic illustrating the main features of a calibration apparatus according to the invention. Apparatus 200 which is shown from its right side view comprises a housing which includes a bottom portion 202 and a back portion 204 which extends upwardly from the back edge of bottom side 202. Apparatus 200 also includes an electronic sensor board 206, which is shown substantially parallel to bottom portion 202. This orientation corresponds to that of a wafer stored in a slot of a standard cassette of the type shown in FIG. 1. Indeed, in a preferred embodiment of the invention the calibration apparatus is intended to calibrate the position of a support platform aimed to carry such a type of wafer cassette with respect to a robot blade. However, for other type of wafer cassettes, e.g., in which the wafer slots would not be horizontally oriented, a calibration apparatus according to the invention would have its electronic sensor board oriented and/or calibrated (as explained further) in order to be adapted to that particular type of cassette. Returning to FIG. 2A, electronic sensor board 206 includes an electronic circuit board 210 and a sensor board 212. Sensor board 212 comprises a plurality of sensors 214 the nature and function of which will be further explained in connection with FIG. 2B. Electronic circuit board 210 contains electronic circuitry suitable for processing information signals transmitted by the plurality of sensors. Electronic circuit board 210 is electrically connected (connections not represented) to a display panel 216 which is mounted on back portion 204 of apparatus 200 according to a preferred embodiment of the invention. As will be explained further, display panel 216 includes means for displaying to a user the result of the processing of the sensor signals by the electronic circuitry within electronic circuit board 210. Now referring to FIG. 2B, the apparatus of FIG. 2A is shown in operation i.e., placed on a support platform of a wafer cassette holder. In FIG. 2B, calibration apparatus 200 rests on support platform 400 of a wafer cassette holder (not shown). Further in FIG. 2B, a robot arm 300 is shown extending inwardly in apparatus 200 between electronic sensor board 206 and bottom portion 202. Robot arm 300 includes a blade 302 which carries a wafer 304. Robot arm 300 is configured extended as if it were about to load/unload a wafer into a standard wafer cassette. Robot blade 302 which holds wafer 304 is positioned underneath sensor board 212. Sensors 214 of sensor board 212 are intended to detect the presence of a wafer placed underneath. Each sensor 214 provides a first electrical signal which is indicative of the variation of the distance between the sensor and the wafer. In a preferred embodiment of the invention these sensors consist of capacitive sensors which are well known in the art. Then, first electrical signals generated by sensors 214 are processed by the electronic circuitry comprised in electronic circuit board 210 which in turn provides a plurality of second electrical signals, each being indicative of the actual distance between the wafer and each of the sensors. Finally, these second electrical signals are transmitted to display panel 216 which displays the distance information in a form that is understandable by the user. Support platform 400 comprises a number of adjusting means 402, typically screws, that allow the user to adjust both vertically and horizontally the position of support platform 400. In operation, the user utilizes adjusting means 402 to adjust the position of support platform 400 so that spacing 217 between sensors 214 and wafer 304 is set to the value required for the position calibration of the support platform to be considered achieved. Display panel 216 provides the user with the distance information upon which the user is able to know that the desirable spacing between each of the sensors 214 and wafer 304 is reached. The "desirable" spacing between each of the sensors and the wafer underneath is the spacing required for the wafer cassette holder to be calibrated with regard to the type of cassette considered. This "desirable" spacing is usually specified by the cassettes manufacturer. In other words, electronic sensor board 206 is arranged within apparatus 200 and calibrated such that when blade 302 carrying a wafer is positioned underneath sensors 214 with the desirable spacing between the sensors and wafer 304, the robot blade is "seen" by the wafer transport system through its robot arm as if it were extending inside a predetermined wafer slot of a standard cassette without any contact. Accordingly, prior to using calibration apparatus 200, the wafer transport system shall be configured e.g., through a computer console associated with it, so that support platform 400 is automatically raised or lowered in such a way such that when robot arm 300 is extended, blade 302 is at a height relatively to support platform 400 that corresponds substantially to that of the predetermined slot of a standard cassette placed on the wafer platform.

Figure 3:
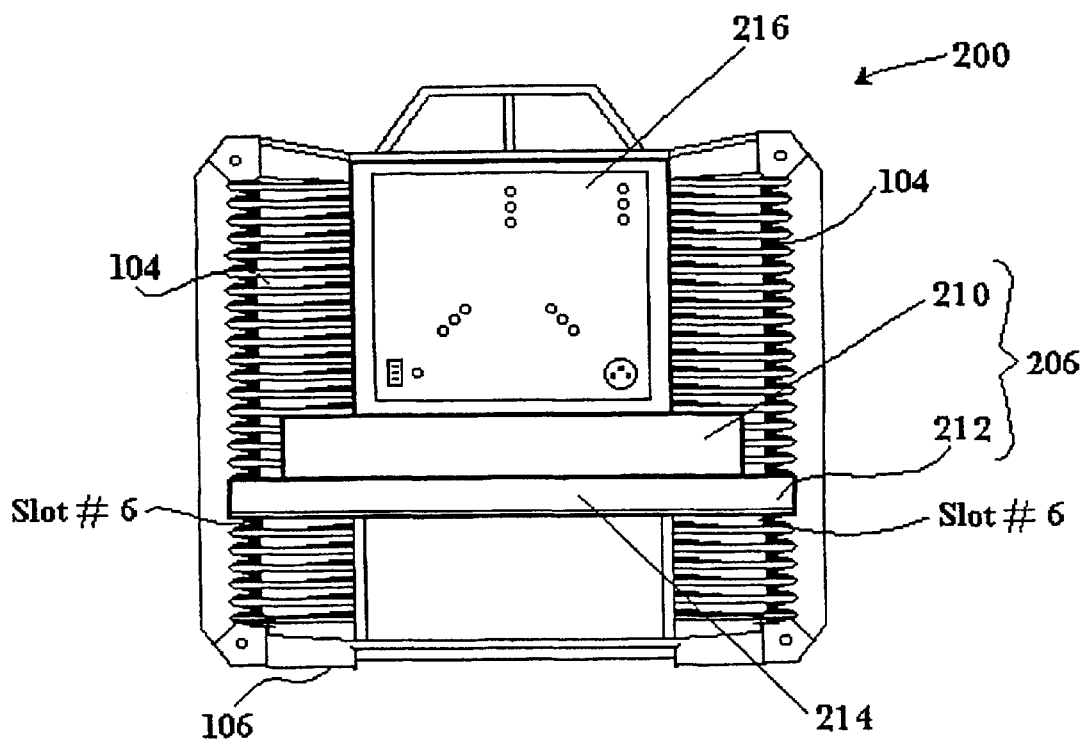
FIG. 3 is a front elevation view of a calibration apparatus in accordance with a preferred embodiment of the invention.
Figure 4:
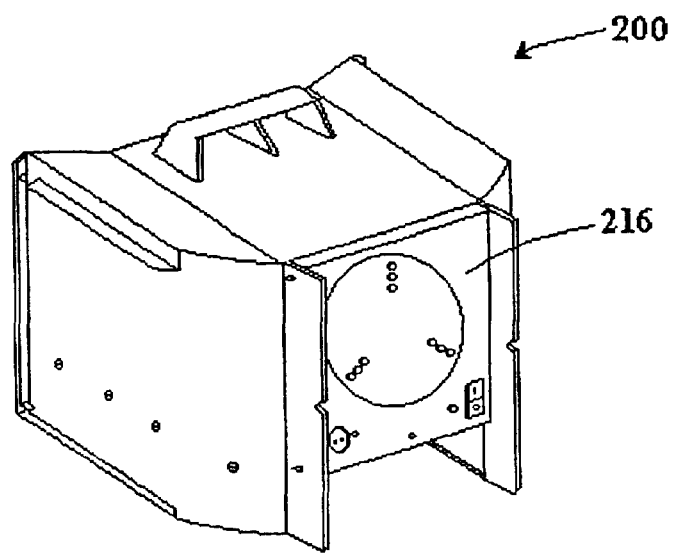
FIG. 4 is a back perspective view of the calibration apparatus of FIG. 3.
Figure 5:
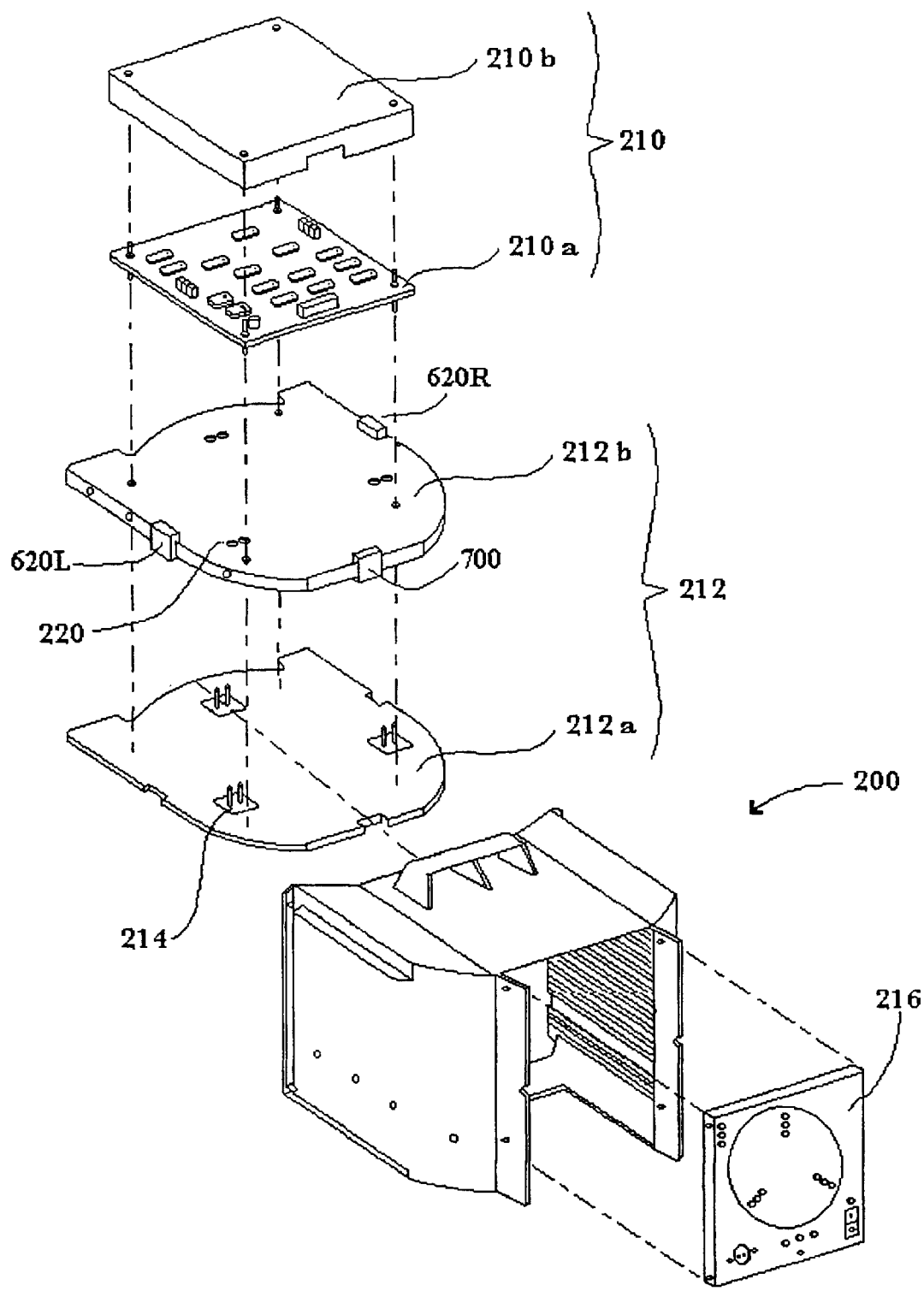
FIG. 5 is an exploded view of the calibration apparatus of FIGS. 3 and 4.

Now with reference to FIGS. 3, 4, and 5, there is illustrated a preferred embodiment of a calibration apparatus according to the invention. As shown in these figures, the apparatus 200 of FIGS. 2A and 2B is preferably implemented in the form of a standard cassette of the type shown in FIG. 1. FIG. 3 shows a front elevation view of the calibration apparatus, while FIG. 4 is a back perspective view of the calibration apparatus. As shown in FIG. 3, electronic sensor board 206 which is comprised of sensor board 212 and electronic circuit board 210 is mounted inside a standard cassette of the type described above in connection with FIG. 1. Electronic sensor board 206 is mounted parallel to slots 104. More specifically, board 206 is mounted at a location immediately above the sixth slot from the base 106 of the cassette (slot #6). While board 206 is shown mounted above slot number 6 (slot #6) according to this embodiment, board 206 could have been mounted higher or lower in the cassette. Still in FIG. 3, the apparatus comprises a display panel 216 which is mounted at the back portion of the cassette as more readily observable in FIG. 4 which shows a back perspective view of the calibration apparatus of FIG. 3.

Now referring to FIG. 5, there is shown an exploded view of the calibration apparatus of FIGS. 3 and 4. As shown in FIG. 5, sensor board 212 comprises sensor base 212a which is mounted on mounting plate 212b. Electronic circuit board 210 comprises printed circuit board 210a on which is mounted a shield cover 210b. Electronic circuit board 210 is also mounted on mounting plate 212b. Terminals of sensors 214 connect circuitry of printed circuit board 210a through holes 220 made in mounting plate 212b. As shown in FIG. 5, sensor base 212a comprises three capacitive sensors 214, one of which being disposed at the front middle portion of sensor base 212a, each of the two others being disposed laterally at opposite sides on the sensor base. Finally, some electronic circuits on board 210a connect display circuits in display panel 216 by means of connection wires (not shown). Still in FIG. 5, mounting plate 212b includes additional sensors 620L, 620R and 700 which will be described further in connection with FIG. 7.

Figure 6:
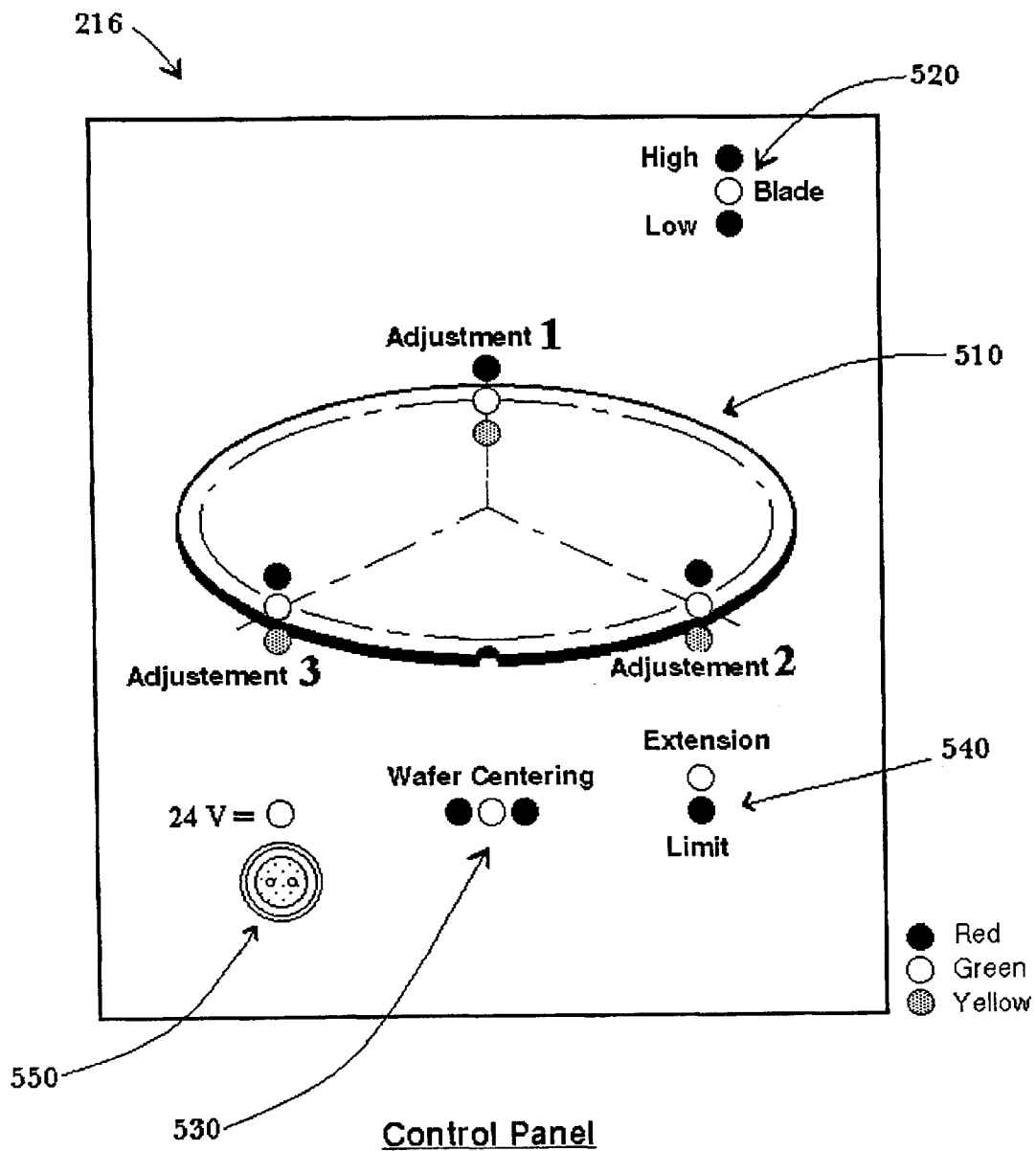
FIG. 6 is a more detailed schematic view of the display panel of the calibration apparatus of FIGS. 3 to 5.

Now with reference to FIG. 6, there is shown a schematic more detailed view of the display panel 216 of the calibration apparatus described above in connection with FIGS. 3 to 5. As already stated in connection with FIGS. 2A and 2B, display panel 216 includes display means referred hereinafter to as "adjustment display means", that provides the user with the distance information upon which the user is able to know that the desirable spacing between each of the sensors 214 and wafer 304 is reached. In accordance with a preferred embodiment of the invention, this information is provided to the user by means of three groups of three light-emitting diodes (LEDs) each, each group being associated with one of the sensors (214). These three groups are indicated in FIG. 6 by numeral 510. Group labeled "Adjustment 1" is associated with the front sensor, and the other two groups respectively labeled "Adjustment 2" and "Adjustment 3" are associated each one with one of the lateral sensors. Each group comprises three LEDs of different color, a higher red one represented by a black point in the figure, a middle green one represented by a white point, and a lower yellow one represented by a shaded point. In addition to the adjustment display means 510, display panel 216 may advantageously include additional display means associated with additional specific circuitry and/or sensors. These additional display means allow to display results of additional measurements. In a preferred embodiment these additional display means are also implemented using LEDs. First additional display means 520 is comprised of three LEDs, a lower red LED and a higher red LED, and a middle green LED. First additional display means 520 as further explained permits the user to measure robot blade "droop". Second additional display means shown at 530 is also comprised of three LEDs (two red and one green) and permits the user to measure the wafer centering. Finally, third additional display means shown at 540 is comprised of two LEDs (one red and one green) and is intended to allow the measuring of the extension limit of the robot blade. Still in FIG. 6, display panel also comprises a power supply connector 550 to receive DC voltage (of 24 volts in a preferred embodiment). Alternatively or additionally, the calibration apparatus of the invention may be internally powered using an internal battery.

Now with reference to FIG. 7, there are shown the different sensors mounted on sensor board 212 of FIG. 5 which are necessary to perform the various measurements whose results are displayed in display panel 216 of FIG. 6, as described above. Sensors shown in FIG. 7 will be described in connection with FIGS. 8A–8C wherein there is shown simplified schematics of the electrical circuitry required to perform each one of the measurements associated with each type of sensors represented in FIG. 7.

In FIG. 7A wafer 304 is shown outside the calibration apparatus of the invention with only top side of sensor board 212 represented. While not represented, it is assumed that wafer 304 is held by the robot blade (FIG. 2B, 302). When the robot blade extends, wafer 304 is brought underneath sensor board 212, and capacitive sensors 214 measure the spacing between sensor base and the wafer to permit adjustment of this spacing to the specified "desirable" spacing, as previously stated. The electronic circuitry that enables such measurement and adjustment will now be described in connection with FIG. 8A.

Wafer to Capacitive Sensors Spacing Measurement

Figure 8A:
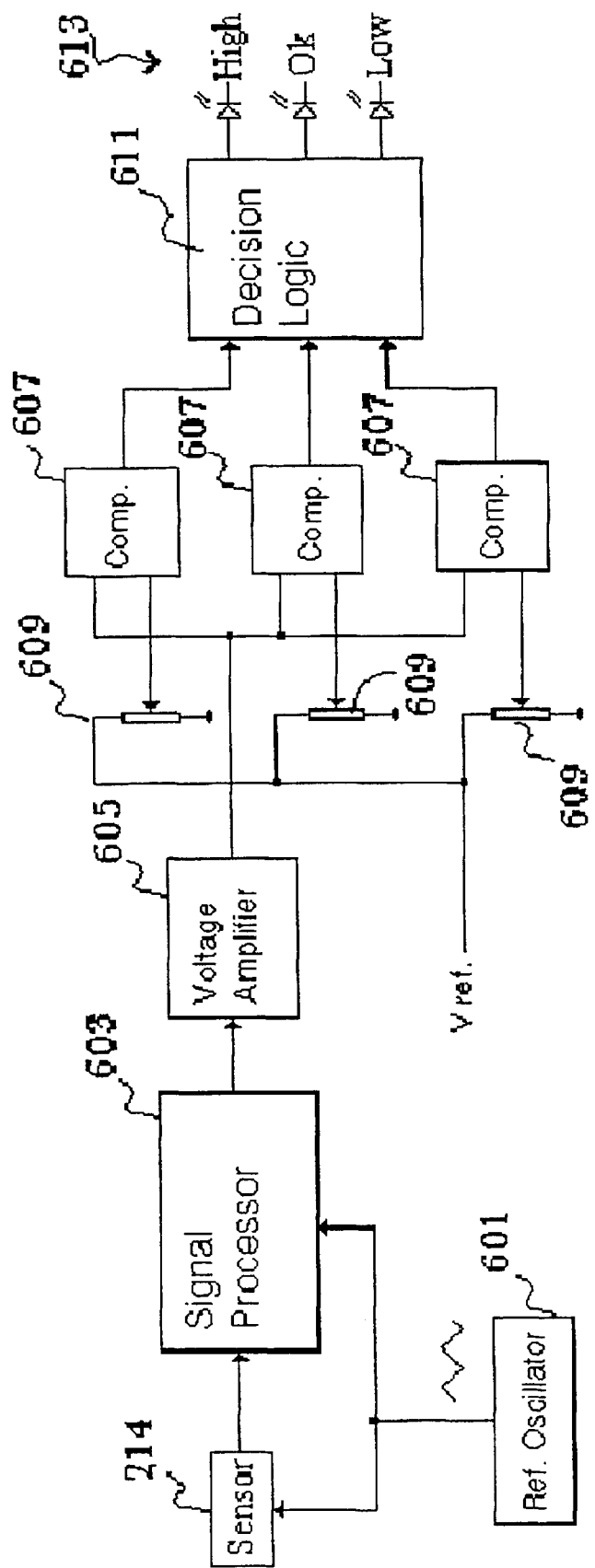
FIGS. 8A–8C show simplified schematics of the electrical circuitry required to perform each one of the measurements associated with each type of sensors shown in FIG. 7.

In FIG. 8A there is shown a simplified schematic of the electrical circuitry necessary to perform spacing measurement and blade twist detection in relation with capacitive sensors 214, the results of which are displayed to the user by means of adjustment display means 510 of display panel 216 shown in FIG. 6. It should be noted that while in FIG. 8A there is shown the circuitry associated with one of the capacitive sensors 214, identical circuitry is associated with each of the other capacitive sensors. In FIG. 8A, a reference oscillator 601 sends to sensor 214 a triangular signal which is modified by sensor 214 to provide a modified signal whose amplitude is proportional to the spacing between the sensor and the wafer. Afterwards, this modified signal is first processed by a signal processor 603 which also receives the triangular signal from oscillator 601, and then amplified by voltage amplifier 605. Voltage amplifier 605 finally provides a DC voltage signal hereinafter called "spacing signal" which is applied to one input terminal of three two-way comparators 607. The other input terminal of each of the comparators 607 is connected to the "variable voltage" terminal of a potentiometer 609 the other two terminals of which being respectively connected to ground potential and a reference potential "Vref". Each potentiometer 609 is pre-adjusted to apply a potential acting as a threshold potential to the corresponding input terminal of a comparator 607. Indeed, at each comparator 607 level, the "spacing signal", which amplitude is proportional to the spacing between capacitive sensor 204 and the wafer, is compared to the threshold potential. Then, each comparator 607 issues a DC signal the value of which being indicative of the result of the comparison. For example a logical "one" may indicates that the "spacing signal" has an amplitude greater than that of the threshold signal, a logical "zero" indicating the contrary. The output terminal of each comparator 607 is then applied to a "decision" logic circuit 611 which activates a determined one of its three output terminals according to the decision taken. Each of the three output terminals of decision logic circuit 611 is connected to one of three LEDs 613 belonging to one of the three groups identified by numeral 510 in FIG. 6. One of the LEDs 613 labeled "high" and of colour red in the display panel shown in FIG. 6, is activated when the spacing between the wafer and sensor 214 reaches a first threshold value that is smaller than the desirable specified spacing. This first spacing threshold value corresponds to one of the three threshold potentials adjusted by potentiometers 609. Conversely, when the spacing between sensor 214 and the wafer reaches a second threshold value which is greater than the desirable spacing, another one of the LEDs 613 is activated, the one labeled "low" on FIG. 8A, and of colour yellow in FIG. 6. Again, the second spacing threshold value corresponds to another one of the three threshold potentials adjusted by potentiometers 609. Finally, when the spacing between sensor 214 and the wafer reaches a third threshold value which is substantially equal to the desirable spacing value, i.e., within a specified tolerance interval, the last one of the LEDs is activated, that is, the LED labeled "OK" in FIG. 8A, and of colour green in FIG. 6. As a consequence, before the wafer cassette holder calibration apparatus of the invention can be used, it should be calibrated. That is, for each of the capacitive sensors 214 (three in the present embodiment), the associated triplet of threshold potentials should be set by adjusting the correspondent potentiometers 607. This initial calibration of the apparatus of the invention will be more detailed further in the description.

Robot Blade Twist Measurement

Sensors 214 with the associated circuitry illustrated by FIG. 8A also enable measurement of what is currently known as "blade twist". "Blade twist" can be defined as the angle that the robot's blade forms relatively to the two primary planes established by two wafers placed in sequential slots in a cassette, when the blade is inclined laterally relatively to its longitudinal axis. Blade twist is detected by display means 510 in FIG. 6, when not the same correspondent LEDs in each of the lateral "Adjustment" groups (2 and 3) is activated at the same time when the robot blade holding the wafer is positioned underneath sensor board 212.

Robot Blade Droop Measurement

Returning to FIG. 6, first additional display means 520 enables measurement of what is sometimes called robot blade "droop". Blade "droop" can be defined as the angle that the blade forms, when it is extended from the robot wrist, relatively to the plane established by the robot arm. Using the apparatus of the invention, this angle is also the one formed between the plane defined by the blade extended and the plane established by sensor base. Using the apparatus of the invention, blade droop is measured as the blade holding a wafer travels underneath the sensor board 212 from front to rear as shown in FIG. 7A. First additional display means 520 in FIG. 6 is coupled to front central capacitive sensor of sensor base 212a and its associated circuitry (see FIG. 8A), but detection is operative when the blade holding a wafer is on its path from front to rear underneath sensor board 212. A defect of parallelism of the blade along its path, is detected by the middle front capacitive sensor if the spacing measured by the sensor between the sensor and the wafer underneath varies whether the blade is at the beginning of its path or at the end of its path. If the spacing does not vary, then there is no blade droop and green LED of display means 520 (FIG. 6) is activated. Conversely, if the spacing varies, there is a blade droop defect and either red diode labelled "high" or red diode labelled "low" in FIG. 6, is activated. The "high" LED is activated, when the first spacing measured is greater than the second one, the "slow" LED is activated in the opposite case.

Wafer Centering Measurement

Figure 8B:
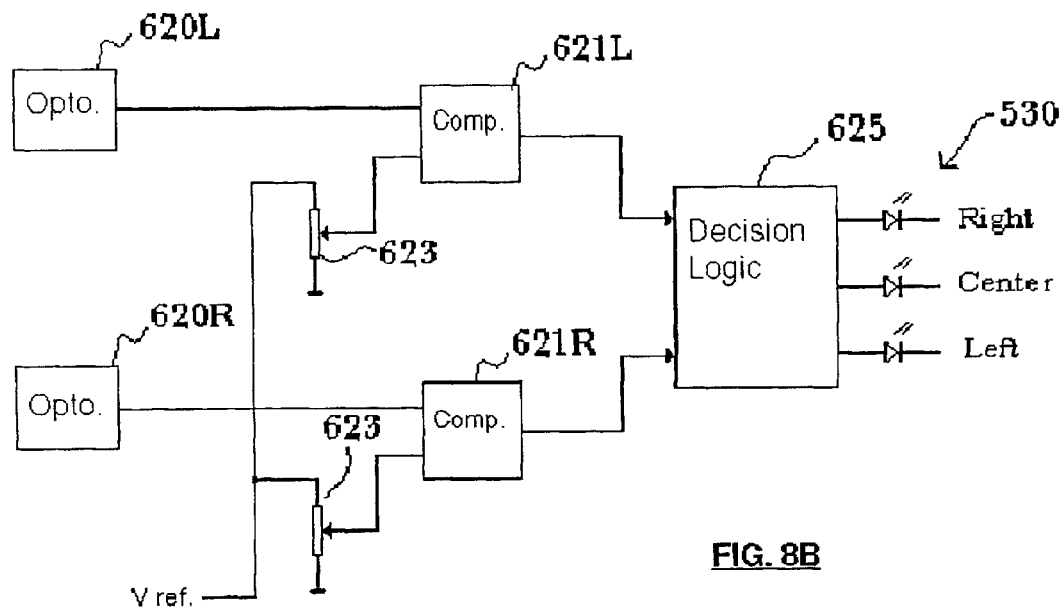
Figure 8C:
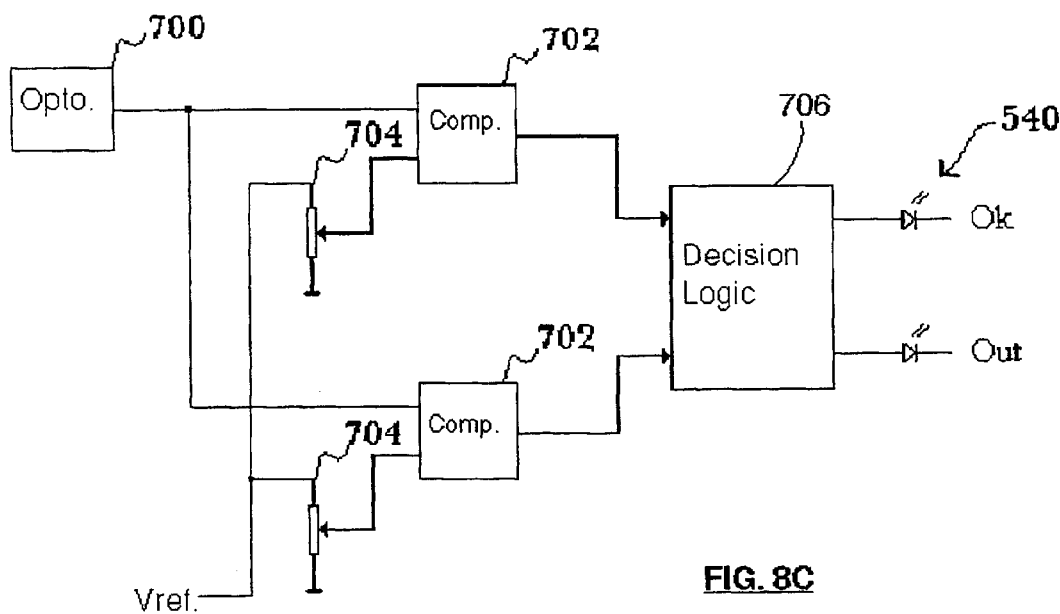

Now, with reference to FIG. 7B, wafer 304 held by robot blade (not represented) is shown positioned underneath sensor board 212. Sensor board 212 additionally includes two laterally disposed sensors 620L and 620R. Additional sensors 620L and 620R are coupled to second additional display means 530 described herein above in connection with FIG. 6, and enables the user to measure the wafer centering. Each of the sensors 620L and 620R can be an optoelectronic sensor in a preferred embodiment of the invention, and is disposed laterally at opposite sides (left and right) of the sensor board 212, so as to detect each the presence underneath of wafer 304 held by the robot blade. Detection information of the presence/non-presence of the wafer provided by sensors 620 is processed through an additional dedicated electronic circuitry which is included in the electronic circuit board (FIG. 5, 210). This additional circuitry is illustrated by the simplified schematic of FIG. 8B in which each optoelectronic sensor 620L, 620R is connected to one input terminal of a comparator circuit 621L, 621R in order to provide the comparator with an electrical signal indicative of the presence/non-presence of a wafer underneath the sensor. The other input terminal of each comparator 621L, 621R is connected, like comparators 607 of FIG. 8A, to the "variable voltage" terminal of a potentiometer 623, the other two terminals of which being respectively connected to ground potential and a reference potential "Vref". Each of potentiometers 623 is pre-adjusted to apply a potential acting as a threshold potential to the corresponding input terminal of one of the comparators 621L,R. Comparators 621L,R work according the same principle of comparators 607 of FIG. 8A, the output signals of which are processed by a decision logic 625 which drives LEDs 530 (FIGS. 6 and 8B). If the two optoelectronic sensors 620L and 620R detect presence of the wafer underneath, then only the center green LED is activated thereby indicating a good centering of the wafer. Conversely, if only one of the sensors (left or right) detects the wafer underneath, the corresponding red diode (left or right) is activated, thereby indicating a bad centering of the wafer.

Robot Blade Extension Limit Measurement

Referring now to FIG. 7C, wafer 304 held by robot blade (not represented) is shown positioned underneath sensor board 212. Sensor board 212 additionally includes one rear optoelectronic sensor 700 which is coupled to third additional display means 540 in display panel 216 shown in FIG. 6. Sensor 700 is intended to detect the wafer underneath when the robot blade is fully extended. A dedicated electronic circuitry which is included in the electronic circuit board (FIG. 5, 210), is associated with sensor 700. This circuitry is illustrated by the simplified schematic of FIG. 8C in which optoelectronic sensor 700 is connected to one input terminal of two comparator circuits 702 in order to provide the comparator with an electrical signal indicative of the presence/non-presence of a wafer underneath the sensor. Sensor 700 is placed on sensor board 212 in such a way, the intensity of this electrical signal varies whether the wafer position is in the specified "extended" position or reaches a "limit" position after which the wafer placed in a slot of a real cassette would contact the bottom of the slot. Indeed, this measurement is intended to prevent any contact that could damage a wafer when it is loaded into a cassette. Returning to FIG. 8C, each comparator 702 is associated with one potentiometer 704 which serves as threshold potential provider in a similar way as in FIGS. 8A and 8B. One of the potentiometer provides the threshold associated with the "extended" position and the other provides the threshold associated with the "limit" position. Then, the result of the comparison between the electrical signal provided by sensor 700 and the two thresholds is processed by a decision logic circuit 706. Finally, decision logic 706 activates green LED labelled "OK" in third display means 540 (FIG. 6 and FIG. 8C) if "extended" position is detected, or activates red LED labelled "OUT" if "limit" position is detected.

It should be noted that all the foregoing robot blade defects (twist, droop, wafer centering defect, and extension limit) detection should be performed by the calibration apparatus of the invention prior to use it to calibrate the alignment of a wafer cassette holder with regard to a robot blade, as previously described in connection with FIG. 2B. Indeed, any robot blade defect detected should be fixed prior to calibrating the cassette holder. In the other hand, the calibration apparatus of the invention should also be calibrated once before use, i.e. setting all the thresholds potentials, defined hereinabove in connection with FIG. 8, by adjusting the corresponding potentiometers of the electronic circuitry of the electronic circuit board (FIG. 5, 210). Actually, the calibration apparatus of the invention is provided to the user with all threshold potentials pre-adjusted with regard to a particular type of cassette. A thresholds calibration "kit" can also be provided to allow the user to periodically check the threshold calibration of the apparatus and/or modify it in order to use the apparatus with different type of wafer cassettes. In particular, this calibration kit includes a gauge pack comprising a plurality of gauges intended to hold a standard wafer, and a planar reference base to place the apparatus on. The principle of this initial threshold calibration of the apparatus of the invention will now be briefly described in connection with FIG. 9.

Initial Calibration of the Wafer Cassette Holder Calibration Apparatus of the Invention In FIG. 9A of FIG. 9, there is illustrated the principle upon which the calibration apparatus of the invention is initially calibrated. In FIG. 9A, the calibration apparatus is placed on a planar reference base 930. A pack of three sets of three gauges each is provided. Each set of three gauges must be disposed (one at a time) on the reference base 930 underneath the three sensors 214. A standard wafer 920 is disposed on the three gauges as shown in FIG. 9B. In this configuration, the spacing between the wafer and each of the sensors 214 is the one which is suitable (for a given type of wafer cassette) to get the same correspondent LED in each of the Adjustment groups in display means 510 of FIG. 6 switched on at the same time. One gauge set is dedicated to the red LEDs, another one to the green LEDs, the last one to the yellow ones. Then the potentiometers (FIG. 8A, 609) may need be adjusted in electronic circuit board 210, so that the good threshold potentials are set in order to obtain the activation of the right LEDs (510) in the display panel (216).

While the invention has been described in terms of a preferred embodiment, those skilled in the art will recognize that the invention can be practiced with variations and modifications. In particular, the apparatus according to the invention may be modified in order to be adapted to any type of wafer cassette and any diameter of wafer. Therefore, it is intended that the appended claims shall be construed to include both preferred embodiment and all variations and modifications thereof that fall within the scope of the invention.

What is claimed is:

1. An apparatus for calibrating the position of a support platform of a wafer cassette holder with respect to a robot blade carrying a wafer, said apparatus comprising:

a housing including an open front portion to permit extending the robot blade into said housing when said apparatus is placed on the support platform, said housing further including;

a detecting means for detecting the wafer, a measuring means for measuring a spacing between said detecting means and the wafer, and a display panel coupled to said detecting means and to said measuring means, including a display means for displaying spacing information which indicates to a user when the spacing between said detecting means and the wafer reaches a predetermined spacing value;

such that, when said apparatus is placed on the support platform with the robot blade holding the wafer positioned within said housing, calibration is carried out in accordance with the spacing information by adjusting the position of the support platform so as to reach a desired spacing value.

2. An apparatus as in claim 1, wherein said display means comprises a plurality of light-emitting diodes.

3. An apparatus as in claim 1, wherein said detecting means and said measuring means comprise a sensing device including a sensor board having a first plurality of sensors; and an electronic circuit;

said electronic circuit coupled to said first plurality of sensors, wherein said electronic circuit processes first electrical signals issued by said first plurality of sensors and said electronic circuit thereby providing second electrical signals communicating to said display panel the spacing between at least one of said first plurality of sensors and said wafer.

4. An apparatus as in claim 3, wherein said display means comprises a plurality of light-emitting diodes, said plurality of light-emitting diodes including a plurality of groups, each group having three diodes, each of the groups being associated with one of said sensors.

5. An apparatus as in claim 3, wherein said first plurality of sensors are capacitive sensors.

6. An apparatus as in claim 3, further comprising two additional sensors disposed in said sensor board;

an additional display means in said display panel; and a first additional circuit;

said additional sensors being coupled to said additional display means through said first additional circuit to enable a wafer centering measurement.

7. An apparatus as in claim 6, wherein said two additional sensors are optoelectronic sensors, and wherein said additional display means comprises three light-emitting diodes.

8. An apparatus as in claim 7, further comprising a third additional sensor disposed in said sensor board;

a second additional display means in said display panel; and a second additional circuit;

said third additional sensor being coupled to said second additional display means through said second additional circuit to enable a robot blade extension limit measurement.

9. An apparatus as in claim 8 wherein said third additional sensor is an optoelectronic sensor, and wherein said second additional display means comprises two light-emitting diodes.

10. An apparatus as in claim 3, wherein said predetermined spacing value is one of a group of three spacing values, one being a manufacturer-defined desired spacing value, another one being less than said desired spacing value, and another being greater than said desired spacing value.

11. An apparatus as in claim 10, further comprising two additional sensors disposed in said sensor board;

an additional display means in said display panel; and a first additional circuit;

said additional sensors being coupled to said additional display means through said first additional circuit to enable a wafer centering measurement.

12. An apparatus as in claim 11, wherein said two additional sensors are optoelectronic sensors, and wherein said additional display means comprises three light-emitting diodes.

13. An apparatus as in claim 12, further comprising a third additional sensor disposed in said sensor board;

a second additional display means in said display panel; and a second additional circuit;

said third additional sensor being coupled to said second additional display means through said second additional circuit to enable a robot blade extension limit measurement.

14. An apparatus as in claim 13 wherein said third additional sensor is an optoelectronic sensor, and wherein said second additional display means comprises two light-emitting diodes.

15. An apparatus as in claim 3, wherein said housing comprises a standard wafer cassette having at least one wafer slot and a back side, wherein said sensor board is mounted substantially parallel to the at least one wafer slot of the wafer cassette, and wherein said display panel is mounted at the back side of the cassette.

16. An apparatus as in claim 15, wherein said predetermined spacing value is one of a group of three spacing values, one being a manufacturer-defined desired spacing value, another one being less than said desired spacing value, and another being greater than said desired spacing value.

17. An apparatus as in claim 6, further comprising two additional sensors disposed in said sensor board;

an additional display means in said display panel; and a first additional circuit;

said additional sensors being coupled to said additional display means through said first additional circuit to enable a wafer centering measurement.

18. An apparatus as in claim 17, wherein said two additional sensors are optoelectronic sensors, and wherein said additional display means comprises three light-emitting diodes.

19. An apparatus as in claim 18, further comprising a third additional sensor disposed in said sensor board;

a second additional display means in said display panel; and a second additional circuit;

said third additional sensor being coupled to said second additional display means through said second additional circuit to enable a robot blade extension limit measurement.

20. An apparatus as in claim 19 wherein said third additional sensor is an optoelectronic sensor, and wherein said second additional display means comprises two light-emitting diodes.

* * * * *